US006473018B2

(12) United States Patent
Ueno et al.

(10) Patent No.: US 6,473,018 B2
(45) Date of Patent: Oct. 29, 2002

(54) DELTA SIGMA ANALOG-TO-DIGITAL CONVERTER

(75) Inventors: Hiroya Ueno; Junji Nakatsuka, both of Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/827,896

(22) Filed: Apr. 9, 2001

(65) Prior Publication Data

US 2001/0033240 A1 Oct. 25, 2001

(30) Foreign Application Priority Data

Apr. 13, 2000 (JP) ........................................ 2000-111782

(51) Int. Cl.$^7$ .............................................. H03M 3/00
(52) U.S. Cl. ...................... 341/143; 341/157; 341/166; 341/167
(58) Field of Search ................................. 341/143, 157, 341/166, 167

(56) References Cited

U.S. PATENT DOCUMENTS

| 4,588,981 | A | * | 5/1986 | Senn ............................ 340/347 |
| 5,134,401 | A | * | 7/1992 | McCartney et al. ......... 333/173 |
| 5,659,314 | A | * | 8/1997 | Tokura et al. ............... 341/143 |
| 5,754,131 | A | * | 5/1998 | Ribner et al. ............... 341/118 |
| 6,037,887 | A | * | 3/2000 | Wu et al. .................... 341/139 |
| 6,064,871 | A | * | 5/2000 | Leung .......................... 341/77 |

* cited by examiner

Primary Examiner—Michael Tokar
Assistant Examiner—Khai Nguyen
(74) Attorney, Agent, or Firm—McDermott, Will & Emery

(57) ABSTRACT

For the realization of a unipolar analog input range, in addition to the provision of an analog input sampling circuit having an input capacitor, a charge transfer circuit, an integrator having an integrating capacitor, a comparator, and a D-type flip-flop, there is further provided a reference voltage sampling circuit for selectively adding either of a subtraction and addition voltages which are different from each other to a sampled analog input voltage in response to a delayed comparator output. The reference voltage sampling circuit has a subtraction and addition capacitors differing in capacitance value from each other.

9 Claims, 6 Drawing Sheets

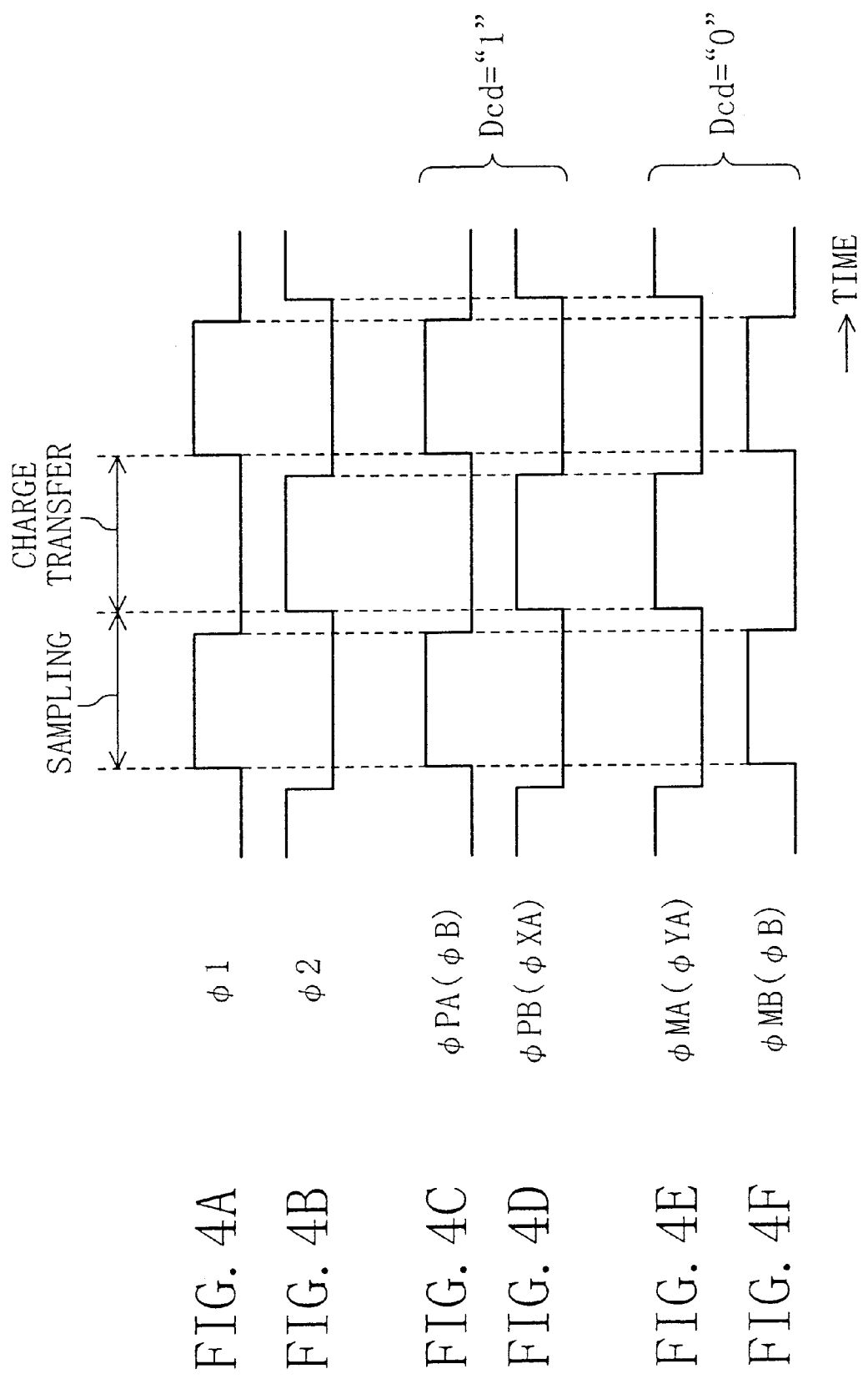

DELTA SIGMA ANALOG-TO-DIGITAL CONVERTER

BACKGROUND OF THE INVENTION

The present invention relates to an analog-to-digital converter (ADC) for analog voltage-to-digital value conversion and, more particularly, to a delta sigma ADC making utilization of a switched capacitor circuit.

U.S. Pat. No. 6,037,887 discloses a delta sigma ADC having programmable gain. However, this ADC has a bipolar analog input range, or an analog input range (e.g., from −10 V to +10 V) in symmetry with respect to signal ground.

In various determination applications, ADCs having a unipolar analog input range (e.g., from 0 V to +10 V) are required. However, conventional delta sigma ADCs are unable to meet such a requirement and half of the bipolar input range is wasted uselessly.

SUMMARY OF THE INVENTION

Accordingly, an object of the present invention is to provide a delta sigma ADC having a unipolar analog input range.

The present invention provides a delta sigma ADC having an analog input range in asymmetry with respect to a certain bias voltage and the delta sigma ADC of the present invention employs a configuration comprising (a) sampling means for sampling, in synchronization with an input clock signal, an analog input voltage, (b) addition/subtraction means for selectively adding either of a subtraction and addition voltages differing from each other to the sampled voltage, (c) an integrator for integrating a voltage obtained by the selective addition, (d) a comparator for comparing a voltage obtained by the integration with the bias voltage, (e) delay means for delaying the output of the comparator by one clock cycle of the input clock signal, and (f) control means for controlling the selection between the subtraction voltage and the addition voltage in the addition/subtraction means in response to the output of the delay means.

BRIEF DESCRIPTION OF THE DRAWINGS

FIGS. 4A–4F are timing chart diagrams showing the waveforms of the various control clock signals in FIG. 3.

DETAILED DESCRIPTION OF THE INVENTION

Figure 1:
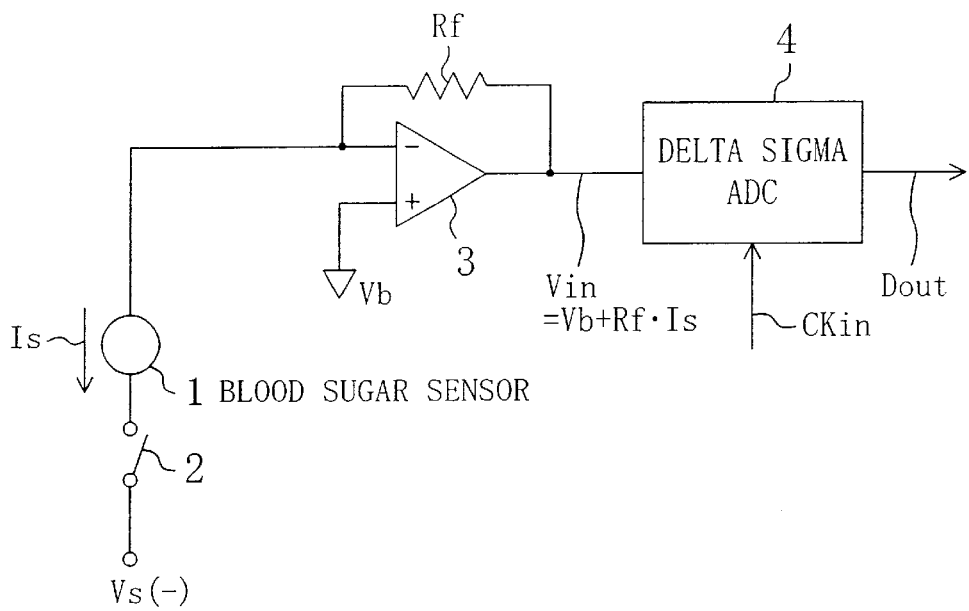
FIG. 1 is a block diagram showing an arrangement of a blood sugar analyzer as an example of the application of a delta sigma ADC according to the present invention.

Referring to FIG. 1, there is shown an arrangement of a blood sugar analyzer as an example of the application of a delta sigma ADC according to the present invention. The blood sugar analyzer of FIG. 1 is equipped with a blood sugar level sensor 1, a switch 2, an operational amplifier 3, a feedback resistor Rf, and a delta sigma ADC 4, for measuring the value of electric current due to the concentration of glucose in the blood. An inverting input terminal of the operational amplifier 3 is connected to one terminal of the blood sugar level sensor 1 and a non-inverting input terminal of the operational amplifier 3 is connected to a bias voltage Vb. The feedback resistor Rf is connected between an output terminal of the operational amplifier 3 and its non-inverting input terminal. The other terminal of the blood sugar level sensor 1 is connected, through the switch 2, to a sensor voltage Vs (−) less than the bias voltage Vb.

With the configuration of FIG. 1, the input impedance of the operational amplifier 3 is very high and the difference in electric potential between the input terminals of the operational amplifier 3 is 0 V at all times. When the switch 2 is closed, the electric potential difference between the bias voltage Vb and the sensor voltage Vs (−) is applied to the blood sugar level sensor 1. This causes a flow of a unidirectional sensor current Is according to the adhered blood in the blood sugar level sensor 1. Therefore, the output voltage of the operational amplifier 3 is Vb+Rf·Is and such a voltage is fed to the delta sigma ADC 4 as an analog input voltage Vin. Here, Vin>Vb holds at all times. The delta sigma ADC 4 operates in synchronization with an input clock signal CKin and performs high-precision conversion of the analog input voltage Vin into a digital output Dout.

Figure 2:
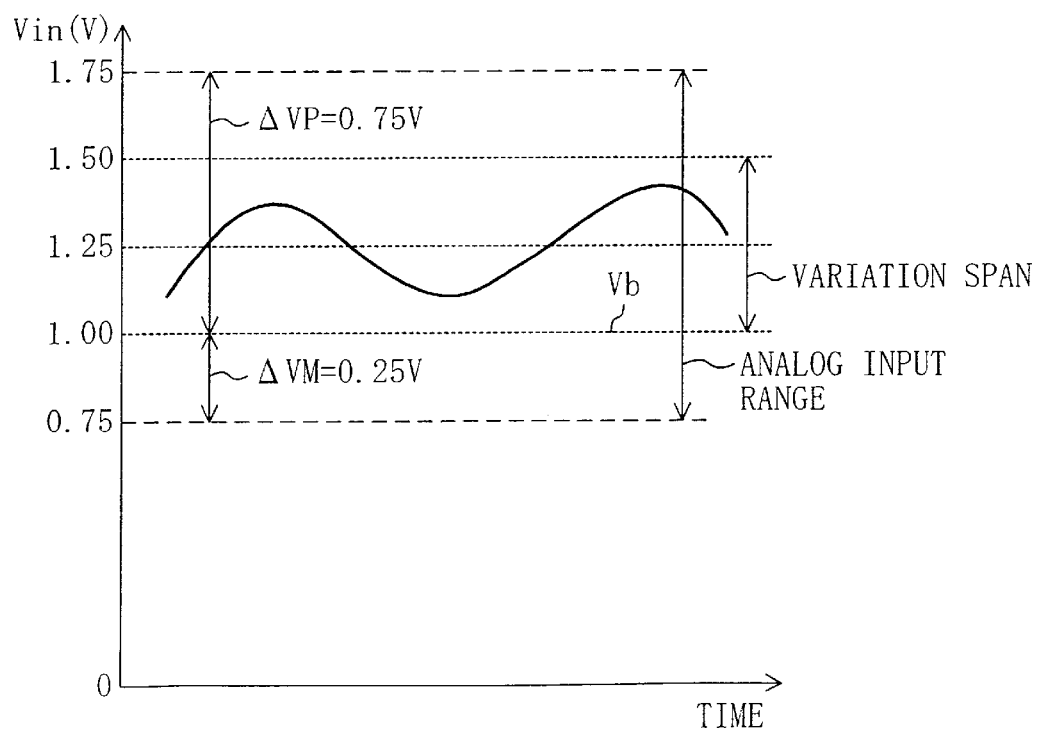
FIG. 2 is a diagram showing an example of the variation in analog input voltage in the delta sigma ADC in FIG. 1.
Figure 3:
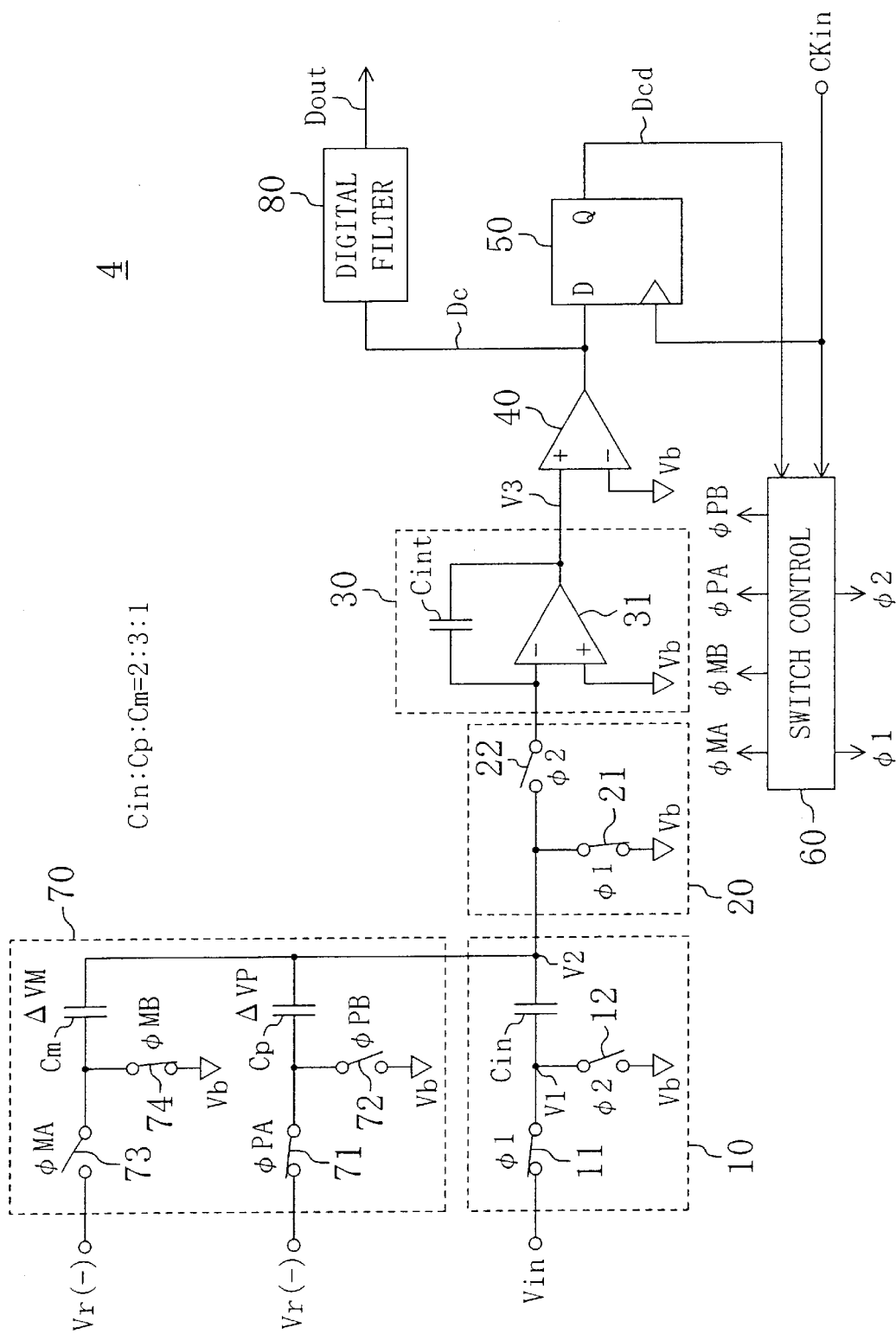
FIG. 3 is a circuit diagram showing a first embodiment of the delta sigma ADC in FIG. 1.
Figure 5A:
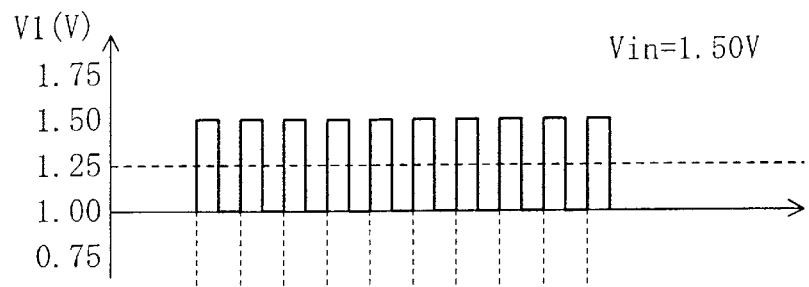
FIGS. 5A–5E are timing chart diagrams showing the waveforms of the various voltages in FIG. 3.
Figure 5B:
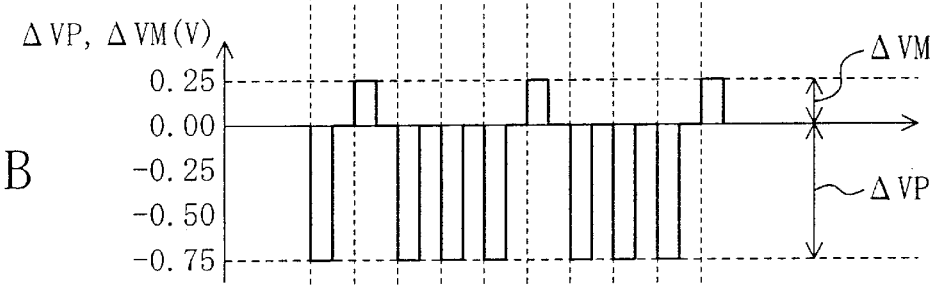
Figure 5C:
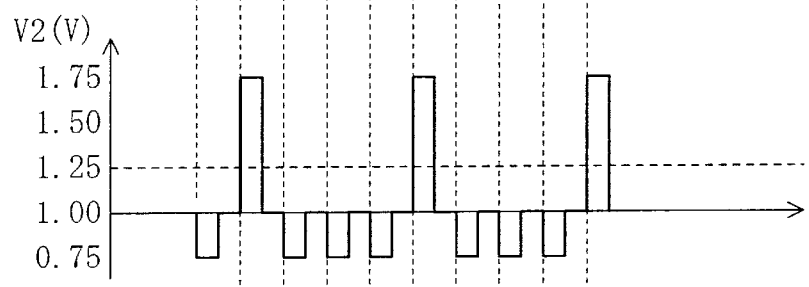
Figure 5D:
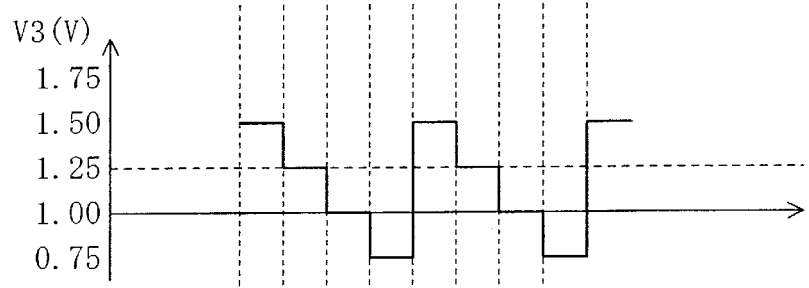
Figure 5E:
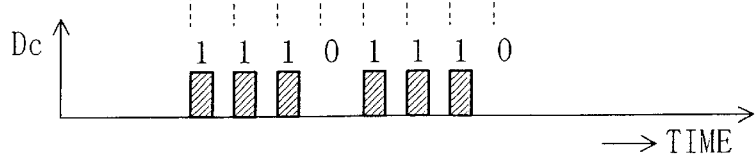

Referring to FIG. 2, there is shown an example of the variation in the analog input voltage Vin in the delta sigma ADC 4 in FIG. 1. Here, the bias voltage Vb is 1.00 V and the normal variation span of the analog input voltage Vin is from 1.00 V up to 1.50 V. However, adding a slight allowance, the analog input range of the delta sigma ADC 4 is from 0.75 V up to 1.75 V. That is, the delta sigma ADC 4 in FIG. 1 has an analog input range in asymmetry with respect to the bias voltage Vb (=1.00 V). Therefore, the input voltage of 1.25 V is equal to the median of the digital output Dout. The subtraction voltage (ΔVP), which will be described later, is 0.75 V and the addition voltage (ΔVM), which will be also described later, is 0.25 V. Referring to FIG. 3, there is shown a first embodiment of the delta sigma ADC 4 in FIG. 1. The delta sigma ADC 4 of FIG. 3 is equipped with an analog input sampling circuit 10, a charge transfer circuit 20, an integrator 30, a comparator 40, a D-type flip-flop 50, a switch controller 60, a reference voltage sampling circuit 70, and a digital filter 80. The analog input sampling circuit 10 comprises an input capacitor Cin and two switches 11 and 12. The charge transfer circuit 20 comprises two switches 21 and 22. The integrator 30 comprises an operational amplifier 31 and an integrating capacitor Cint. The reference voltage sampling circuit 70 comprises a subtraction capacitor Cp, an addition capacitor Cm, and four switches 71, 72, 73, and 74. The output terminals of the input capacitor Cin, the subtraction capacitor Cp, and the addition capacitor Cm are connected together to form an addition point. The capacitance ratio Cin:Cp:Cm is, for example, 2:3:1. The integrating capacitor Cin is connected between an inverting input terminal and an output terminal of the operational amplifier 31, a non-inverting input terminal of which is connected to the bias voltage Vb. The comparator 40 receives the output of the integrator 30 and the bias voltage Vb at its non-inverting and inverting input terminals, respectively. Dc is the comparator output. Dcd is the delayed comparator output (the amount of delay is one clock cycle of the input clock signal CKin). φ1, φ2, φPA, φPB, φMA and φMB are the control clock signals which are supplied by the switch controller 60. Vr (−) is the feedback reference voltage less than the bias voltage Vb.

ΔVP is the subtraction voltage which is accumulated and held in the addition capacitor Cp. ΔVM is the addition voltage which is accumulated and held in the subtraction capacitor Cm. V1 is the sampled analog input voltage. V2 is the voltage at the addition point. V3 is the integrated output.

Referring to FIGS. 4A–4F, there are shown the waveforms of the various control clock signals in FIG. 3. The switches 11 and 21 are on-off controlled in response to the signal φ1 of FIG. 4A and the switches 12 and 22 are on-off controlled in response to the signal φ2 of FIG. 4B. The period, during which the signal φ1 is a "1", is called the "sampling period". On the other hand, the period, during which the signal φ2 is a "1", is called the "charge transfer period". In the sampling period, the analog input voltage Vin is connected, through the switch 11, to the input terminal of the input capacitor Cin, the output terminal of which is connected, through the switch 21, to the bias voltage Vb. As a result, the input capacitor Cin is charged and its interterminal voltage becomes Vin−Vb. Further, in the charge transfer period, the bias voltage Vb is connected, through the switch 12, to the input terminal of the input capacitor Cin, the output terminal of which is connected, through the switch 22, to the inverting input terminal of the operational amplifier 31.

If Dcd="1", this causes the switch controller 60 to supply the signal φPA (=φ1) and the signal φPB (=φ2) to the reference voltage sampling circuit 70 (see FIGS. 4C and 4D). Therefore, in the sampling period, the feedback reference voltage Vr (−) is connected, through the switch 71, to the input terminal of the subtraction capacitor Cp, whereas in the charge transfer period the bias voltage Vb is connected, through the switch 72, to the input terminal of the subtraction capacitor Cp. In the sampling period, the switch 21 is turned on, whereas in the charge transfer period the switch 22 is turned on. As a result, in the sampling period, the voltage ΔVP is accumulated and held in the subtraction capacitor Cp, whereas in the charge transfer period, the voltage ΔVP thus stored is added to the voltage of the input capacitor Cin and supplied to the integrator 30, whereby the integrating capacitor Cint is charged.

If Dcd="0", this causes the switch controller 60 to supply the signal φMA (=φ2) and the signal φMB (=φ1) to the reference voltage sampling circuit 70 (see FIGS. 4E and 4F). Therefore, in the sampling period, the bias voltage Vb is connected, through the switch 74, to the input terminal of the addition capacitor Cm, whereas in the charge transfer period the feedback reference voltage Vr (−) is connected, through the switch 73, to the input terminal of the addition capacitor Cm. In the sampling period, the switch 21 is turned on, whereas in the charge transfer period the switch 22 is turned on. As a result, in the sampling period, the addition capacitor Cm enters the discharge state. And, in the charge transfer period, the voltage ΔVM is accumulated and held in the addition capacitor Cm and the voltage ΔVM thus stored is added to the voltage of the input capacitor Cin and supplied to the integrator 30, whereby the integrating capacitor Cint is charged.

Here, since the voltage ΔVP which is stored in the capacitor Cp and the voltage ΔVM which is stored in the capacitor Cm have polarities opposite to each other, the voltage ΔVP is called the subtraction voltage and the voltage ΔVM is called the addition voltage. Further, as shown in FIG. 2, the subtraction voltage ΔVP and the addition voltage ΔVM differ in size from each other. Furthermore, according to the analog input range of FIG. 2, all bits of the comparator output Dc are a "1" for Vin=1.75 V. On the other hand, all bits of the comparator output Dc are a "0" for Vin=0.75 V.

Moreover, when Vin=1.25 V, bits "0" and "1" are output at a ratio of 1:1 as the comparator output Dc.

Referring to FIGS. 5A–5E, there are shown the waveforms of the various voltages in FIG. 3 for Vin=1.50 V. In this case, bits "0" and "1" are output at a ratio of 1:3 as the comparator output Dc.

As described above, with the configuration of FIG. 3, it is possible to selectively add to the sampled input voltage either of the subtraction voltage ΔVP and the addition voltage ΔVM differing in size from each other, thereby making it possible to realize the delta sigma ADC 4 having a unipolar analog input range.

Figure 6:
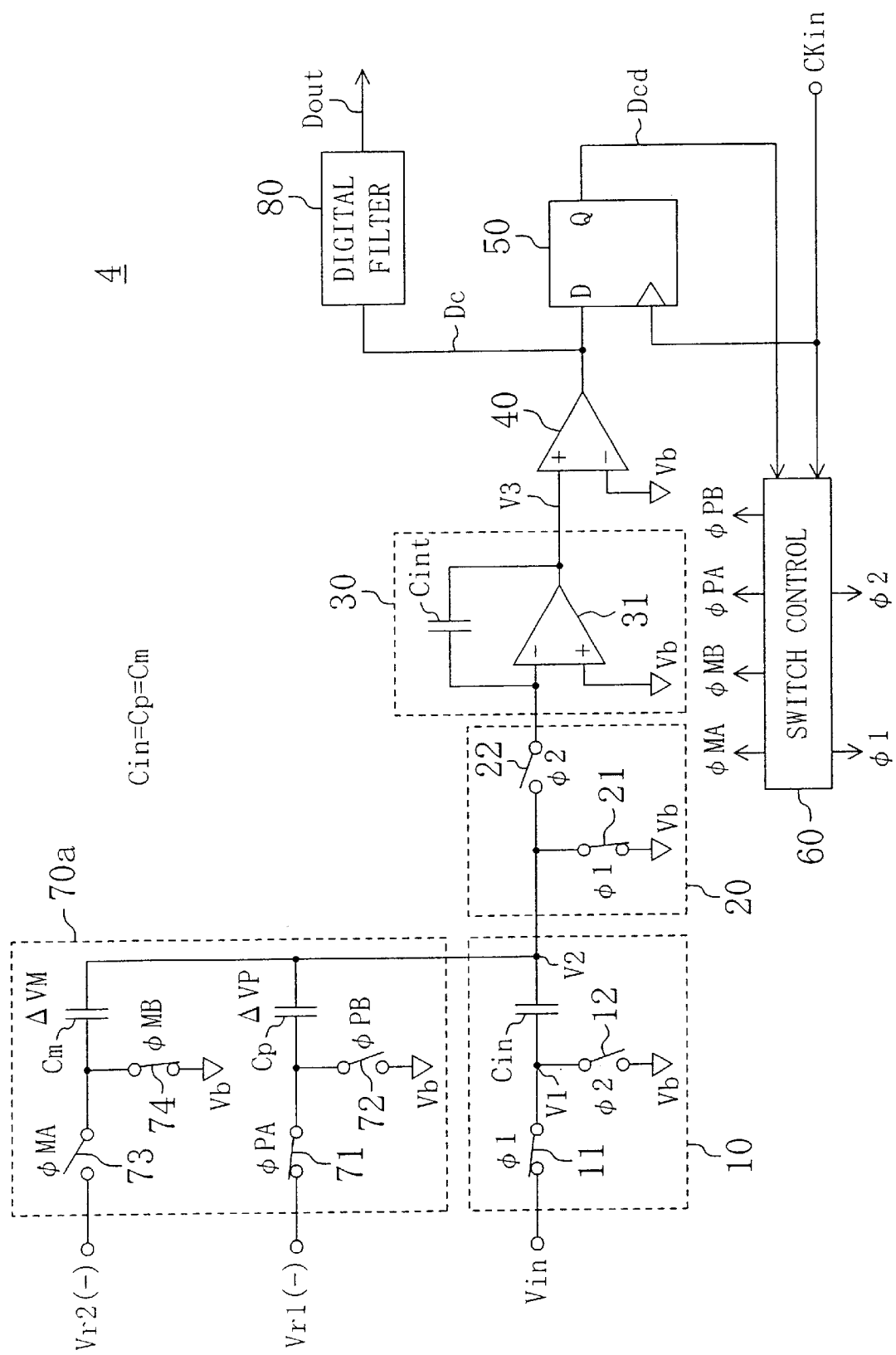
FIG. 6 is a circuit diagram showing a second embodiment of the delta sigma ADC in FIG. 1.

Referring to FIG. 6, there is shown a second embodiment of the delta sigma ADC 4 in FIG. 1. The difference from FIG. 3 is the provision of a reference voltage sampling circuit 70a. In other words, in the configuration of FIG. 6, the difference between the subtraction voltage ΔVP and the addition voltage ΔVM is produced not by the capacitance value difference but by the voltage value difference and the input capacitor Cin, the subtraction capacitor Cp, and the addition capacitor Cm have the same capacitance value. The waveforms of the control clock signals φ1, φ2, φPA, φPB, φMA, and φMB are as shown in FIGS. 4A–4F.

More specifically, when Dcd="1", in the sampling period, a first feedback reference voltage Vr1 (−) less than the bias voltage Vb is connected, through the switch 71, to the input terminal of the subtraction capacitor Cp, whereas in the charge transfer period the bias voltage Vb is connected, through the switch 72, to the input terminal of the subtraction capacitor Cp. When Dcd="0", in the sampling period, the bias voltage Vb is connected, through the switch 74, to the input terminal of the addition capacitor Cm, whereas in the charge transfer period a second feedback reference voltage Vr2 (−) less than the bias voltage Vb and different from the first feedback reference voltage Vr1 (−) is connected, through the switch 73, to the input terminal of the addition capacitor Cm.

Accordingly, also with the configuration of FIG. 6, it is possible to selectively add to the sampled input voltage either of the subtraction voltage ΔVP and the addition voltage ΔVM differing in size from each other. Additionally, according to the FIG. 6 configuration, it is possible to design the analog input sampling circuit 10 and the reference voltage sampling circuit 70a with the same capacitance, thereby providing a simplified layout.

Figure 7:
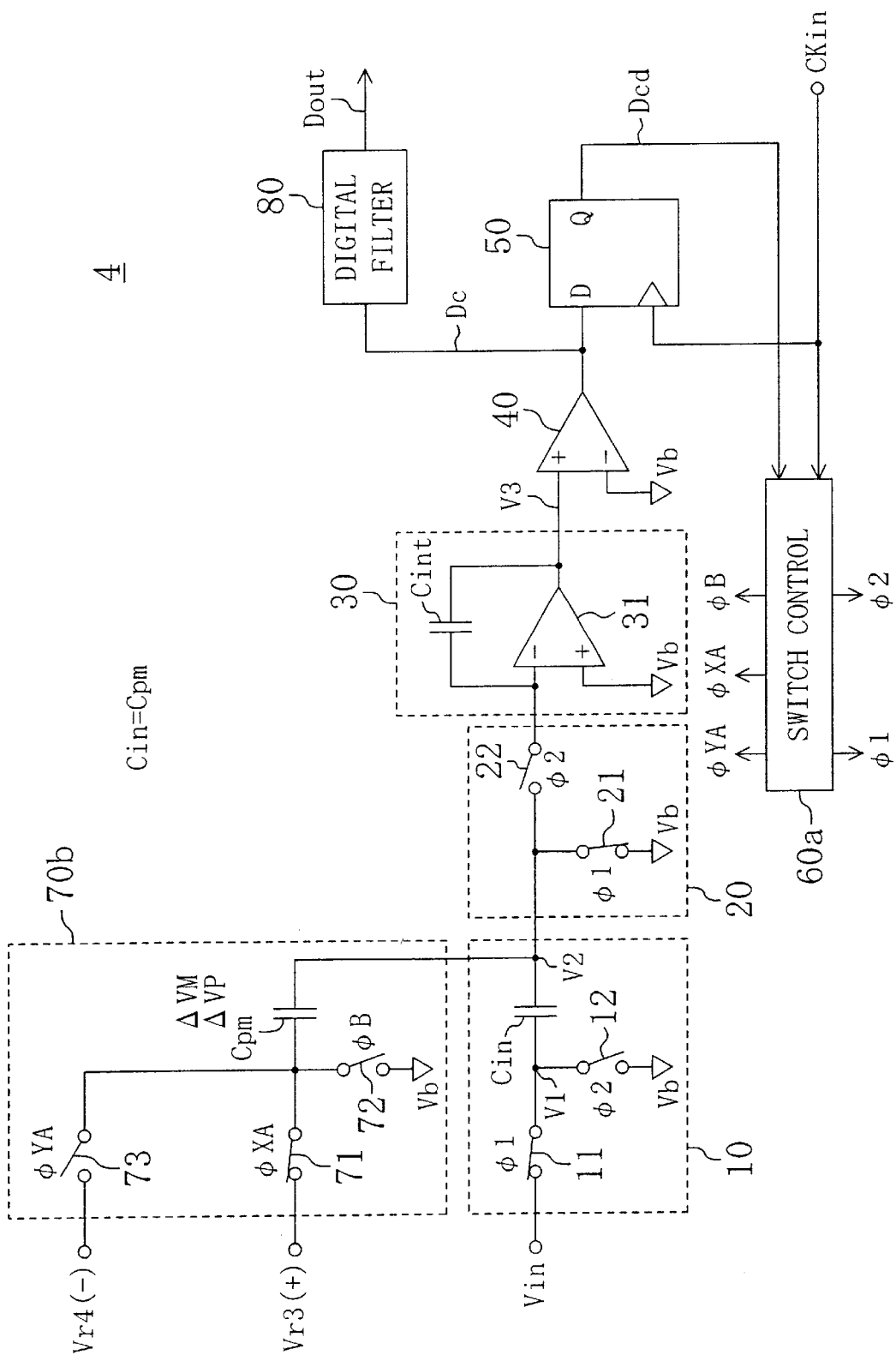
FIG. 7 is a circuit diagram showing a third embodiment of the delta sigma ADC in FIG. 1.

Referring to FIG. 7, there is shown a third embodiment of the delta sigma ADC 4 in FIG. 1. The difference from FIG. 6 is the provision of a switch controller 60a and a reference voltage sampling circuit 70b. In other words, in the configuration of FIG. 7, a single addition/subtraction capacitor Cpm for selectively storing either the subtraction voltage ΔVP or the addition voltage ΔVM is introduced in the reference voltage sampling circuit 70b and the number of switches is reduced down to three. The input capacitor. Cin and the addition/subtraction capacitor Cpm have the :same capacitance. φ1, φ2, φXA, φYA, and φB are control clock signals which are supplied by the switch controller 60a. The waveforms of these control clock signals, of which the signals φXA, φYA, and φB are enclosed in parentheses, are as shown in FIGS. 4C–4F.

More specifically, in the sampling period, the bias voltage Vb is connected, through the switch 72, to the input terminal of the addition/subtraction capacitor Cpm, regardless of the value of the delayed comparator output Dcd. In the charge transfer period, if Dcd="1", a third feedback reference voltage Vr3 (+) more than the bias voltage Vb is connected, through the switch 71, to the input terminal of the addition/subtraction capacitor Cpm, whereas if Dcd="0", a fourth feedback reference voltage Vr4 (−) less than the bias voltage Vb is connected, through the switch 73, to the input terminal of the addition/subtraction capacitor Cpm. Here, the potential difference between the third feedback reference voltage Vr3 (+) and the bias voltage Vb and that between the bias voltage Vb and the fourth feedback reference voltage Vr4 (−) are so set as not to agree with each other.

Accordingly, also with the configuration of FIG. 7, it is possible to selectively add to the sampled input voltage either of the subtraction voltage ΔVP and the addition voltage ΔVM differing in size from each other. Additionally, according to the FIG. 7 configuration, it is possible to reduce the numbers of capacitors and switches when compared with the FIG. 6 configuration.

Further, in the delta sigma ADC 4 according to each of the foregoing embodiments, a positive unipolar input range (from 0.75 V up to 1.75 V) is realized, provided that Vb=1.00 V and Vin>Vb holds at all times. However, the bias voltage Vb is arbitrary. Further, the present invention is applicable to delta sigma ADCs having a negative unipolar input range if Vin<Vb holds at all times.

Furthermore, as other examples of the application of the delta sigma ADC according to the present invention, ADCs for determination employing chemical reactions, e.g., for cholesterol analyzers, and for conversion of an analog current flowing in the photodiode in one direction into a digital value, can be given.

What is claims is:

1. A delta sigma analog-to-digital converter (ADC) having an analog input range in asymmetry with respect to a certain bias voltage, said delta sigma ADC comprising:
    sampling means for sampling, in synchronization with an input clock signal, an analog input voltage;
    addition/subtraction means for selectively adding either of a subtraction and addition voltages differing from each other to said sampled voltage;
    an integrator for integrating a voltage obtained by said selective addition;
    a comparator for comparing a voltage obtained by said integration with said bias voltage;
    delay means for delaying the output of said comparator by one clock cycle of said input clock signal; and
    control means for controlling the selection between said subtraction voltage and said addition voltage in said addition/subtraction means in response to the output of said delay means.

2. The delta sigma ADC of claim 1, said sampling means including:
    an input capacitor; and
    a switch circuit by which in a sampling period said analog input voltage is connected to an input terminal of said input capacitor and, at the same time, an output terminal of said input capacitor is connected to said bias voltage whereas in a charge transfer period said bias voltage is connected to said input terminal of said input capacitor and, at the same time, said output terminal of said input capacitor is connected to an input of said integrator.

3. The delta sigma ADC of claim 2, said addition/subtraction means including:
    a subtraction capacitor with an output terminal connected to said output terminal of said input capacitor;
    an addition capacitor with an output terminal connected to said output terminal of said input capacitor, said addition capacitor having a capacitance value different from that of said subtraction capacitor;
    a subtraction switch circuit by which, when the output of said delay means is a "1", a feedback reference voltage less than said bias voltage is connected to an input terminal of said subtraction capacitor in said sampling period whereas in said charge transfer period said bias voltage is connected to said input terminal of said subtraction capacitor; and
    an addition switch circuit by which, when the output of said delay means is a "0", said bias voltage is connected to an input terminal of said addition capacitor in said sampling period whereas in said charge transfer period the same voltage as said feedback reference voltage is connected to said input terminal of said subtraction capacitor.

4. The delta sigma ADC of claim 2, said addition/subtraction means including:
    a subtraction capacitor with an output terminal connected to said output terminal of said input capacitor, and an addition capacitor with an output terminal connected to said output terminal of said input capacitor, said subtraction and addition capacitors having the same capacitance value as said input capacitor;
    a subtraction switch circuit by which, when the output of said delay means is a "1", a first feedback reference voltage less than said bias voltage is connected to an input terminal of said subtraction capacitor in said sampling period whereas in said charge transfer period said bias voltage is connected to said input terminal of said subtraction capacitor; and
    an addition switch circuit by which, when the output of said delay means is a "0", said bias voltage is connected to an input terminal of said addition capacitor in said sampling period whereas in said charge transfer period a second feedback reference voltage less than said bias voltage and different from said first feedback reference voltage is connected to said input terminal of said addition capacitor.

5. The delta sigma ADC of claim 2, said addition/subtraction means including:
    an addition/subtraction capacitor with an output terminal connected to said output terminal of said input capacitor, said addition/subtraction capacitor having the same capacitance value as said input capacitor; and
    an addition/subtraction switch circuit by which said bias voltage is connected to an input terminal of said addition/subtraction capacitor in said sampling period whereas, in said charge transfer period, a third feedback reference voltage more than said bias voltage is connected to said input terminal of said addition/subtraction capacitor when the output of said delay means is a "1" and a fourth feedback reference voltage less than said bias voltage is connected to said input terminal of said addition/subtraction capacitor when the output of said delay means is a "0";
    wherein the difference in electric potential between said third feedback reference voltage and said bias voltage is so set as not to agree with the difference in electric potential between said bias voltage and said fourth feedback reference voltage.

6. The delta sigma ADC of claim 1, said integrator including:
    an operational amplifier with an inverting input terminal for receiving a voltage obtained by said selective addition and a non-inverting input terminal connected to said bias voltage; and an integrating capacitor connected between said inverting input terminal of said operational amplifier and an output terminal of said operational amplifier.

7. The delta sigma ADC of claim 1, wherein said delay means is formed by a D-type flip-flop.

8. The delta sigma ADC of cliam 1, wherein said subtraction voltage and said addition voltage have opposite polarities.

9. A blood sugar analyzer comprising:

a delta sigma analog-to-digital converter (ADC);

an amplifier for supplying an analog input voltage to said delta sigma ADC; and a blood sugar level sensor for supplying to said amplifier a sensor current flowing in one direction;

said delta sigma ADC having an analog input range in asymmetry with respect to a certain bias voltage, said delta sigma ADC comprising:

sampling means for sampling, in synchronization with an input clock signal, an analog input voltage;

addition/subtraction means for selectively adding either of a subtraction and addition voltages differing from each other to said sampled voltage;

an integrator for integrating a voltage obtained by said selective addition;

a comparator for comparing a voltage obtained by said integration with said bias voltage;

delay means for delaying the output of said comparator by one clock cycle of said input clock signal; and control means for controlling the selection between said subtraction voltage and said addition voltage in said addition/subtraction means in response to the output of said delay means.

* * * * *